US012075554B2

(12) United States Patent
Chen et al.

(10) Patent No.: US 12,075,554 B2
(45) Date of Patent: Aug. 27, 2024

(54) PLASMA SOURCE HAVING A DIELECTRIC PLASMA CHAMBER WITH IMPROVED PLASMA RESISTANCE

(71) Applicant: MKS Instruments, Inc., Andover, MA (US)

(72) Inventors: Xing Chen, Lexington, MA (US); Ilya Pokidov, North Reading, MA (US); Atul Gupta, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 406 days.

(21) Appl. No.: 17/237,913

(22) Filed: Apr. 22, 2021

(65) Prior Publication Data

US 2021/0243876 A1    Aug. 5, 2021

Related U.S. Application Data

(63) Continuation of application No. 16/035,551, filed on Jul. 13, 2018, now Pat. No. 11,019,715.

(51) Int. Cl.
*H05H 1/46* (2006.01)
*H01J 37/32* (2006.01)

(52) U.S. Cl.
CPC ............ *H05H 1/46* (2013.01); *H01J 37/321* (2013.01); *H01J 37/32357* (2013.01); *H01J 37/32467* (2013.01); *H01J 37/32522* (2013.01)

(58) Field of Classification Search
CPC .......... H01J 37/32357; H01J 37/32522; H01J 37/3255; H01J 37/321; H01J 37/32513
See application file for complete search history.

(56) References Cited

U.S. PATENT DOCUMENTS

| 2,179,774 | A  | 11/1939 | Zerbe |
| 4,406,458 | A  | 9/1983  | Maier |
| 4,835,359 | A  | 5/1989  | Sciortino |
| 5,457,298 | A  | 10/1995 | Nelson et al. |
| 6,150,628 | A  | 11/2000 | Smith et al. |
| 6,815,633 | B1 | 11/2004 | Chen et al. |

(Continued)

FOREIGN PATENT DOCUMENTS

| CN | 1919678 A | 2/2007 |
| CN | 201153345 Y * | 11/2008 |

(Continued)

OTHER PUBLICATIONS

Chinese Search Report for Chinese Application No. 201980060008.8 dated Apr. 19, 2023, pp. 1-3.

(Continued)

*Primary Examiner* — Thien S Tran
(74) *Attorney, Agent, or Firm* — Cesari and McKenna, LLP

(57) ABSTRACT

A plasma chamber of a plasma processing system is provided. The plasma chamber defines a plasma channel having a first side and a second side oppositely disposed along a length of the plasma channel. The plasma chamber comprises a first section and a second section constructed from a dielectric material and an interface that bonds together the first and second sections at between a first flange of the first section and a third flange of the second section and between a second flange of the first section and a fourth flange of the second section.

21 Claims, 13 Drawing Sheets

(56) References Cited

U.S. PATENT DOCUMENTS

| | | |
|---|---|---|
| 7,166,816 B1 | 1/2007 | Chen et al. |
| 7,501,600 B2 | 3/2009 | Holber et al. |
| 7,659,489 B2 | 2/2010 | Holber et al. |
| 8,053,700 B2 | 11/2011 | Schuss et al. |
| 9,451,686 B2 | 9/2016 | Choi |
| 9,773,645 B2 | 9/2017 | Lee et al. |
| 10,124,436 B2 | 11/2018 | Tanaka |
| 10,435,081 B2 | 10/2019 | Otsuka et al. |
| 10,479,532 B2 | 11/2019 | Ballinger et al. |
| 2002/0125225 A1 | 9/2002 | Smith et al. |
| 2003/0015965 A1 | 1/2003 | Godyak |
| 2004/0206730 A1 | 10/2004 | Holber et al. |
| 2006/0086699 A1* | 4/2006 | Holber .................. H01J 37/321 219/121.54 |
| 2007/0079935 A1* | 4/2007 | Schuss .............. H01J 37/32522 156/345.37 |
| 2007/0145018 A1 | 6/2007 | Smith et al. |
| 2014/0272108 A1 | 9/2014 | Holber et al. |
| 2017/0062183 A1 | 3/2017 | Taniguchi et al. |
| 2017/0213704 A1 | 7/2017 | Chen et al. |
| 2017/0221685 A1* | 8/2017 | Zhang .................... C23C 14/35 |

FOREIGN PATENT DOCUMENTS

| | | |
|---|---|---|
| CN | 201820736 U | 5/2011 |
| CN | 105144849 A | 12/2015 |
| CN | 105728970 A | 7/2016 |
| CN | 106465530 A | 2/2017 |
| KR | 10-2017-0035141 A | 3/2017 |
| KR | 10-2018-0010816 A | 1/2018 |
| TW | 200505292 A | 2/2005 |
| TW | 200732499 A | 9/2007 |
| TW | 201501775 A | 1/2015 |
| WO | 99/00823 A1 | 1/1999 |
| WO | 02/052060 A1 | 4/2002 |

OTHER PUBLICATIONS

"Korean Office Action," Korean Intellectual Property Office ("KIPO"), Korean Application No. 10-2023-7015682, Date of Mailing: Jun. 12, 2024, pp. 1-8.

* cited by examiner

SECTION B-B

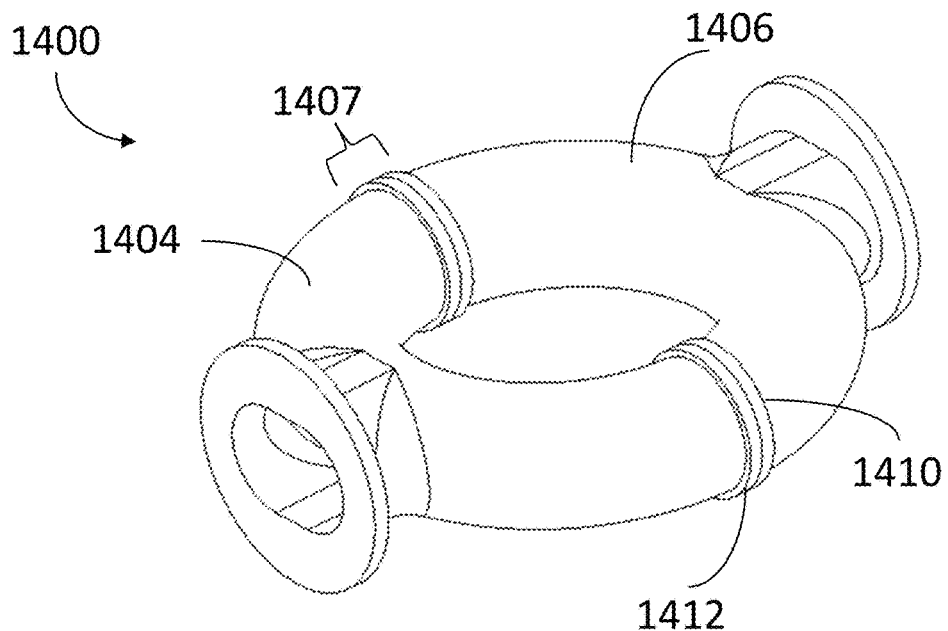
FIG. 14a
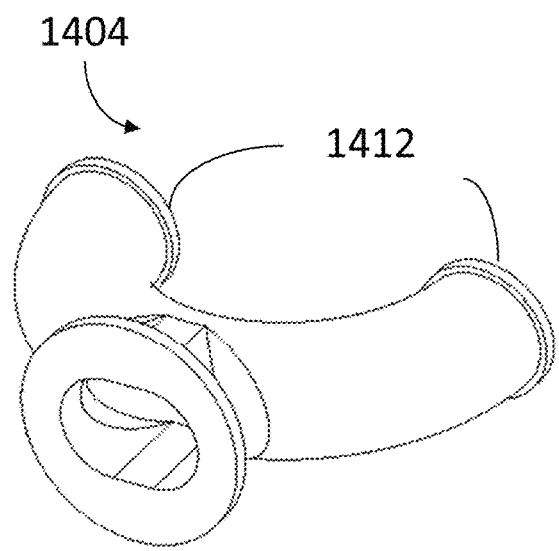 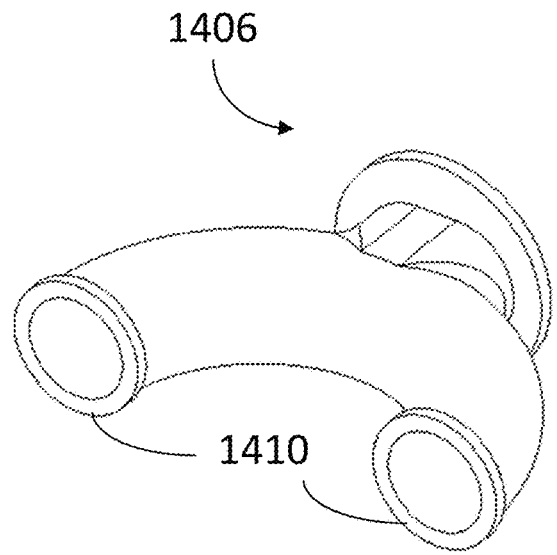
FIG. 14b　　　　　　　　FIG. 14c

PLASMA SOURCE HAVING A DIELECTRIC PLASMA CHAMBER WITH IMPROVED PLASMA RESISTANCE

CROSS REFERENCE TO RELATED APPLICATION

This application claims the benefit of and priority to U.S. patent application Ser. No. 16/035,551, filed on Jul. 13, 2018, the entire content of which is owned by the assignee of the instant application and incorporated herein by reference in its entirety.

FIELD OF THE INVENTION

The present invention generally relates to the field of plasma generation and processing equipment and, more particularly, to apparatuses and methods for plasma generation and processing with improved resistance to plasma chemistries and contamination.

BACKGROUND

Plasma discharges can be used to excite gases to produce activated gases containing ions, free radicals, atoms and molecules. Activated gases are used for numerous industrial and scientific applications, including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e., a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other applications include etching of and depositing material into high aspect ratio structures. Other applications require shielding the material being processed from the plasma because the material is sensitive to damage caused by ions or because the process has high selectivity requirements.

Plasmas can be generated in various ways including direct current (DC) discharge, radio frequency (RF) discharge, and microwave discharge. DC discharges are achieved by applying a potential between two electrodes in a gas. RF discharges are achieved either by capacitively or inductively coupling energy from a power supply into a plasma. Microwave discharges can be produced by coupling a microwave energy source to a discharge chamber containing a gas.

Plasma discharges can be generated in a manner such that both the charged species constituting the plasma and the neutral species, which can be activated by the plasma, are in intimate contact with the material being processed. Alternatively, the plasma discharge can be generated remotely from the material being processed, so that relatively few of the charged species come into contact with the material being processed, while the neutral species can still contact it. Such a plasma discharge is commonly termed a remote or downstream plasma discharge. Depending on its construction, positioning relative to the material being processed, and operating conditions (e.g., gas species, pressure, flow rate, and power coupled into the plasma), a plasma source can have characteristics of either or both of these two general types.

Existing remote plasma sources generally utilize RF or microwave power to generate the plasma. Although present sources support many applications successfully, several technical limitations remain in the practical use of those sources. For example, microwave-based remote plasma sources are generally more expensive than RF sources because microwave power is generally more expensive to produce, deliver and match to a load. Microwave sources and a power delivery system are also generally more bulky than RF sources and require periodic replacement of a tube which generates the microwave power.

RF remote plasma sources that have some degree of capacitive as well as inductive coupling may be less expensive and smaller than the corresponding microwave sources. The capacitive coupling, however, which assists in the plasma ignition process, may lead to degradation of the exposed walls of the plasma chamber due to bombardment of those walls by energetic ions produced in the plasma. RF remote plasma sources that utilize inductive RF coupling, but which minimize associated capacitive coupling, may show less ion-induced degradation of the plasma vessel surfaces. The reduction or elimination of the capacitive coupling, however, can make plasma ignition more difficult to obtain, especially over a wide range of process conditions.

A second difficulty with existing remote plasma sources is removal of the heat generated in the plasma and deposited onto the walls of the plasma chamber. This is especially the case when the plasma chamber has a complex shape and/or when it is composed of a dielectric material for which direct cooling with large quantities of fluid in contact with the dielectric plasma chamber is either undesirable or impractical. This has the effect of limiting the power that can be reliably coupled into the plasma.

Some of the existing plasma chambers, such as the ones described in U.S. Pat. No. 7,659,489, are manufactured using a quartz material by a combination of high-temperature forming and welding to produce a desired shape (e.g., a torus shape). One main disadvantage of a quartz plasma chamber is that it is incompatible with hydrogen and/or halogen plasma chemistries, such as hydrogen (H*), Fluoride (F*), and/or chlorine (Cl*), due to a high rate of chemical and physical erosion of quartz when exposed to these chemistries.

In addition, some existing plasma chambers, such as the ones described in U.S. Pat. No. 7,166,816, are manufactured by machining several plasma blocks from aluminum, where the plasma blocks are connected to form a plasma channel of a desired shape (e.g., a torus shape). The internal surface of the plasma channel can be coated using either a deposition process (e.g., chemical vapor deposition, physical vapor deposition or plasma spray) or a conversion process (e.g., hard anodization) to form a dielectric barrier between the base metal and the plasma. One disadvantage of a plasma chamber made from aluminum plasma blocks with dielectric coating is that the coating is typically thin, on the order of a few to tens of micrometers, and therefore cannot withstand high plasma ignition voltages required for igniting in-process gas due to electrical breakdown of the dielectric coating. An inert gas such as argon may be used as ignition gas to lower the ignition voltages, but the transition from ignition gas to process gas leads to a time delay that reduces throughput in pulsed plasma applications. Another disadvantage with thin coatings is that they are unable to adequately protect the plasma chamber body if a defect in the coatings exposes the underlying aluminum to reactive gases in the plasma chamber. Moreover, in the case of conversion coatings, such as using hard anodization, the purity of the coating that is directly exposed to plasma depends on the purity of the base aluminum alloy. For instance, 6061 aluminum has an aluminum content of 95.8-98.6%, with the balance being other metallic alloying elements. These other metallic impurities can become potential sources of contamination in semiconductor processing. Also, many machined plasma channel geometries have deep holes with an aspect ratio (ratio of length to diameter) in the range of 2:1 to 10:1. Such high aspect ratio holes are impractical to coat using physical vapor deposition (PVD) or plasma spray methods, as these coatings are applied from an open end and can result in much smaller than necessary coating thickness in hard to reach areas. High aspect ratio holes can be conformally coated using other deposition processes, such as chemical vapor deposition (CVD) or atomic layer deposition (ALD), for example. However, deposition rates for CVD and ALD are much lower than those for spray coating, making these deposition processes slow and prohibitively expensive.

Further, some existing plasma chambers, such as the ones described in U.S. Pat. No. 8,053,700, are formed by connecting multiple generally linear dielectric tubes to achieve a desired shape (e.g., a torus shape). Although the use of generally linear tubes as building blocks of a plasma chamber widens the range of available materials available, the main disadvantage is that it increases the manufacturing complexity and cost.

SUMMARY

There is a need for plasma chambers having improved resistance to certain plasma chemistries, such as hydrogen and/or halogen plasma chemistries while minimizing metallic contamination in semiconductor processing. There is also a need for plasma chambers that can be manufactured with less complexity and cost.

The present invention provides thick-walled plasma chambers capable of igniting in-process gases, where the plasma chambers can be manufactured from high purity dielectric materials that are compatible with (e.g., having a low erosion rate in) plasma chemistries, such as hydrogen and/or halogen plasma chemistries. The high purity dielectric materials can also minimize metallic contamination in semiconductor processing. The high purity dielectric materials further offer improved thermo-mechanical properties.

In one aspect, a plasma chamber of a plasma processing system is provided. The plasma chamber defines a plasma channel having a first side and a second side oppositely disposed along a length of the plasma channel. The plasma chamber comprises a first section constructed from a dielectric material. The first section has (i) a first flange positioned along the first side of the plasma channel and extending beyond the first side by a first width, and (ii) a second flange positioned along the second side of the plasma channel and extending beyond the second side by a second width. The plasma chamber also comprises a second section constructed from the dielectric material. The second section has (i) a third flange positioned along the first side of the plasma channel and extending beyond the first side by the first width, and (ii) a fourth flange positioned along the second side of the plasma channel and extending beyond the second side by the second width. The plasma chamber further comprises an interface that bonds together the first and second sections between the first and third flanges and between the second and fourth flanges.

In another aspect, a method of manufacturing a plasma chamber of a plasma processing system is provided. The plasma chamber defines a plasma channel having a first side and a second side oppositely disposed along a length of the plasma channel. The method comprises constructing a first section from a dielectric material. The first section has (i) a first flange positioned along the first side of the plasma channel and extending beyond the first side by a first width, and (ii) a second flange positioned along the second side of the plasma channel and extending beyond the second side by a second width. The method also comprises constructing a second section from the dielectric material. The second section has (i) a third flange positioned along the first side of the plasma channel and extending beyond the first side by the first width, and (ii) a fourth flange positioned along the second side of the plasma channel and extending beyond the second side by the second width. The method further comprises bonding the first and second sections together to form the plasma chamber having the plasma channel for containing a plasma therein. Bonding the first and second sections comprises forming bonding between the first and third flanges to generate a first bonded flange having the first width and between the second and fourth flanges to generate a second bonded flange having the second width.

Any of the above aspects can include one or more of the following features. In some embodiments, the dielectric material is alumina ($Al_2O_3$) ceramic. In some embodiments, the dielectric material is an oxide or a nitride of one of a group II element, a group III element, a lanthanide, or a mixture thereof. In some embodiments, the dielectric material is one of $Y_2O_3$, $Sc_2O_3$ $La_2O_3$, $Ce_2O_3$, or MgO. In some embodiments, the dielectric material is one of AlN, BN, or YN.

In some embodiments, a coating is disposed on an inner surface of the plasma chamber that forms at least a portion of the plasma channel exposed to a plasma therein. The coating can comprise one of $Al_2O_3$, $Y_2O_3$, $Sc_2O_3$, $La_2O_3$, $Ce_2O_3$, MgO, $SiO_2$, $B_4C$ or an alloy including YAG.

In some embodiments, the first and second sections are substantially identical. In some embodiments, a thickness of a wall of the first or second section is between about 0.04 inches and about 0.12 inches. In some embodiments, the first or second section is constructed by machining the dielectric material in a green state.

In some embodiments, the plasma chamber further includes (i) a first bonded flange formed by the bonding of the first and third flanges, where the first bonded flange has the first width, and (ii) a second bonded flange formed by the bonding of the second and fourth flanges, where the second bonded flange has the second width. In some embodiments, the first width of the first bonded flange or the second width of the second bonded flange is between about 0.06 inches and about 1 inch. For example, the first or second width can be about 0.25 inches.

In some embodiments, the bonding interface comprises a bonding agent that is one of a glass frit, a eutectic mixture or an epoxy. For example, the eutectic mixture can comprise one or more of $Al_2O_3$, $Y_2O_3$, Sc2O3, Ce2O3, MgO, CaO, or $ZrO_2$. In some embodiments, the first and second sections are bonded together by sintering the first and second sections together to create a hermetic seal at the first and second bonded flanges. In some embodiments, a layer of alloying agent can be disposed on an inner surface of at least one of the first section or the second section prior to the sintering. The inner surface is adapted to form at least a portion of the plasma channel exposed to the plasma therein. An alloyed coating is created on at least a portion of the inner surface having the layer of alloying agent disposed thereon by the sintering process that bonds the first and second sections.

In some embodiments, the plasma channel forms a toroidal loop. The toroidal plasma channel can be circular, oval, elliptical or polygon in shape. In some embodiments, the plasma channel is linear. In some embodiments, a cross section of the plasma channel is circular, rectangular or oval in shape. An area of the cross section of the plasma channel can be between about 0.2 cm² and about 50 cm².

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

FIGS. 14a-14c illustrate an exemplary plasma chamber, according to some embodiments of the present invention.

DETAILED DESCRIPTION

Figure 1:
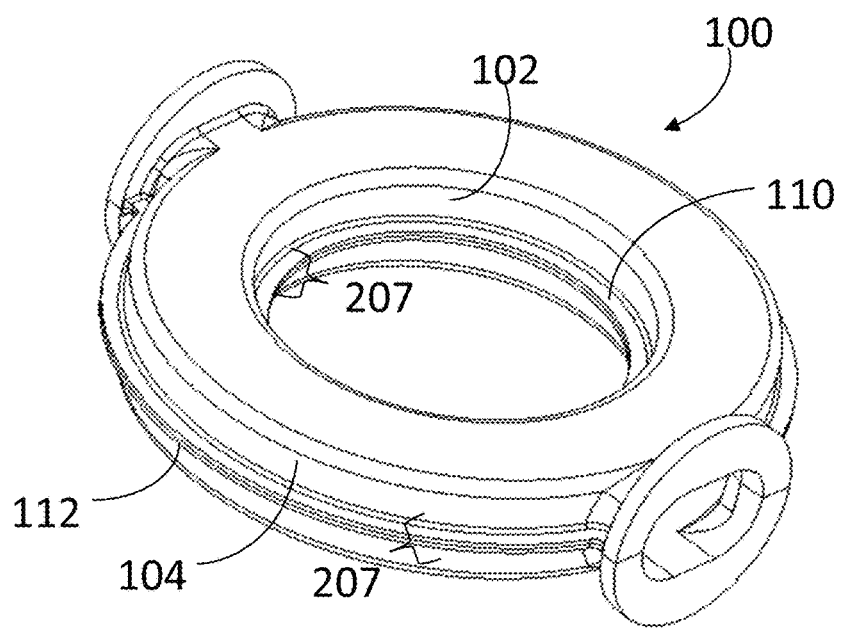
FIG. 1 shows an exemplary plasma chamber, according to some embodiments of the present invention.

FIG. 1 shows an exemplary plasma chamber 100, according to some embodiments of the present invention. Generally, a plasma chamber is a container or a portion of a container that contains a gas and/or a plasma and within which a plasma can be ignited and or/maintained. A plasma chamber is adapted to be combined with other components, such as power generation and cooling components, to form a plasma processing system. A plasma chamber typically defines one or more plasma channels having a variety of shapes. For example, a plasma channel can have a linear shape or a loop shape (e.g., to support a toroidal plasma). As shown in FIG. 1, the plasma chamber 100 can be a toroidal loop, which is defined as forming a looped internal plasma channel (not shown) with a closed path to support plasma current circulation in the closed path.

The plasma chamber 100, including the plasma channel, has a first side 102 and a second side 104 oppositely disposed along the length of the plasma channel. The plasma chamber 100 also includes a first bonded flange 110 extending from the first side 102 by a first width. The plasma chamber 100 further includes a second bonded flange 112 extending from the second side 102 by a second width. Specifically, for the circular toroidal plasma chamber 100 illustrated in FIG. 1, the first bonded flange 110 extends inward from the first/inner side 102 by the first width and the second bonded flange 112 extends outward from the second/outer side 104 by the second width. Generally, the dimensions of the circular toroidal plasma chamber 100, such as the inner radius (i.e., from the center of the circular toroidal plasma chamber 100 to the first side 102) and the outer radius (i.e., from the center of the circular toroidal plasma chamber 100 to the second side 104), are defined based on the required flow rate of the process gas in the plasma channel and the required plasma power. In some embodiments, the outer radius of the circular toroidal plasma chamber 100 is about 6 inches.

Figure 2:
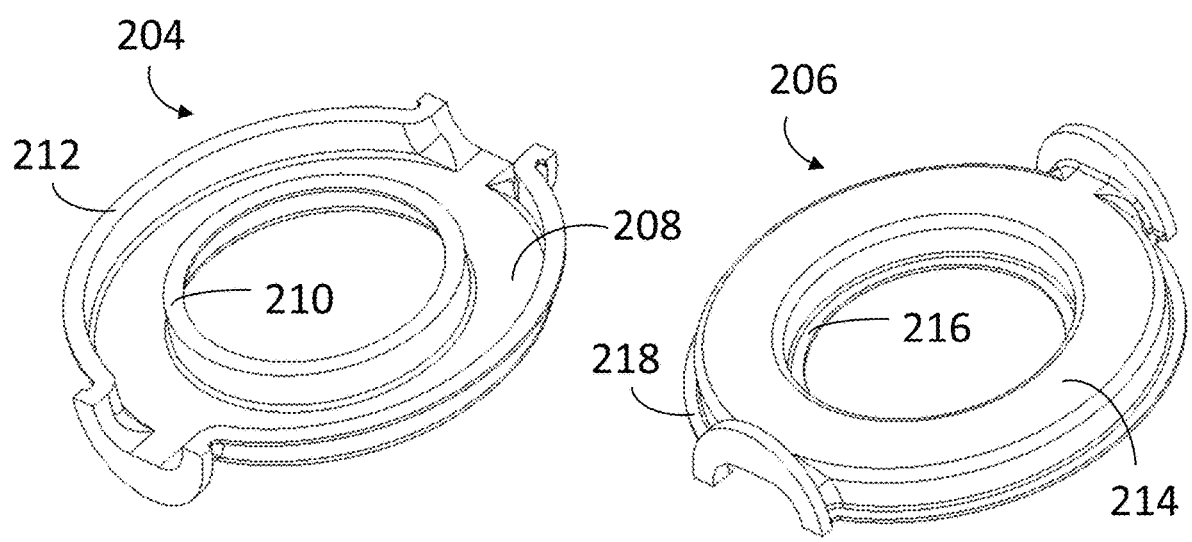
FIG. 2 shows an exemplary assembly for forming the plasma chamber of FIG. 1, according to some embodiments of the present invention.

FIG. 2 shows an exemplary assembly for forming the plasma chamber 100 of FIG. 1, according to some embodiments of the present invention. The plasma chamber 100 is constructed from several discrete sections, including a first section 204, which can form a bottom half of the plasma chamber 100, a second section 206, which can form a top half of the plasma chamber 100, and a bonding interface 207 (shown in FIG. 1) that bonds together the first and second sections 204, 206 of the plasma chamber 100. The first and second sections 204, 206 and the bonding interface 207 can be constructed from the same dielectric material or two or more different dielectric materials.

As shown, the first section 204 defines (i) a first wall portion 208 with an inner surface defining a portion of the plasma channel, (ii) a first flange 210 positioned along the first side 102 of the plasma channel and extending beyond first side 102 by the first width, and (iii) a second flange 212 positioned along the second side 104 of the plasma channel and extending beyond the second side 104 by the second width. Similarly, the second section 206 defines (i) a second wall portion 214 with an inner surface defining another portion of the plasma channel, (ii) a third flange 216 positioned along the first side 102 of the plasma channel and extending beyond the first side 102 by the first width, and (iii) a fourth flange 218 positioned along the second side 104 of the plasma channel and extending beyond the second side 104 by the second width. The bonding interface 207 is formed by bonding together the first and second sections 204, 206 between the first and third flanges 210, 216 and between the second and fourth flanges 212, 218 of the first and second sections 204, 206, respectively. Specifically, the bonding at the bonding interface 207 is adapted to form the plasma chamber 100 as a monolithic structure comprising: (i) the first and second wall portions 208, 214 cooperatively defining the plasma channel for containing a gas and/or plasma therein, (ii) the first and third flanges 210, 216 cooperatively defining the first bonded flange 110 with the first width, and (iii) the second and fourth flanges 212, 218 cooperatively defining the second bonded flange 112 with the second width. In some embodiments, the first width of the first bonded flange 110 and/or the second width of the second bonded flange 112 are between about 0.06 inches and about 1 inch. For example, both the first or second width can be about 0.25 inches.

Generally, the bond strength for forming the first bonded flange 110 or the second bonded flange 112 at the bonding interface 207 is proportional to the amount of surface area at the bonding interface 207. In the absence of bonded flanges 110, 112, a relatively thin first wall portion 208 and/or a second wall portion 214 of the plasma chamber 100 are adapted to create a thin bonding interface 207 that can compromise bonding reliability, even if the thin walls are beneficial for mitigating thermal stress. Hence, the first bonded flange 110 and the second bonded flange 112 are used to ensure a more reliable and sturdy bond between the first and second sections 204, 206 of the plasma chamber 100. This advantageously allows the thickness of the first wall portion 208 and second wall portion 214 to be independently optimized for minimization of thermo-mechanical stress.

In some embodiments, the first and second sections 204, 206 of the plasma chamber 100 are substantially identical. In some embodiments, each of the first and second sections 204, 206 is formed from a dielectric material and machined in a green state. These two sections 204, 206 of the plasma chamber 100 can be bonded by any one of the following bonding approaches including: (i) applying and melting a glass frit at the flanges 210, 212, 216, 218 to form a glass joint at the bonded flanges 110, 112, (ii) applying an eutectic mixture comprising one or more of $Al_2O_3$, $Y_2O_3$, $Sc_2O_3$, $Ce_2O_3$, MgO, CaO, or $ZrO_2$ at the flanges 210, 212, 216, 218 and sintering the two sections 204,206 together to form the bonded flanges 110, 112, (iii) co-firing the two sections 204,206 together to form the bonded flanges 110, 112, or (iv) applying a high-temperature epoxy at the flanges 210, 212, 216, 218 and curing the two sections 204,206 together to form the bonded flanges 110, 112. A strong hermetic seal can be formed at the bonded flanges 110, 112.

As described above, the plasma chamber 100, including the first and second sections 204, 206, can be made from the same dielectric material or different dielectric materials. Typically, the resistance of a particular material to plasma is measured in term of etch rate (e.g., the rate of material removal per unit time measured in microns per minute). In some embodiments, the dielectric material used to construct the plasma chamber 100 is a high purity (e.g., about 99.5% to about 99.9%) alumina ($Al_2O_3$) ceramic material that is selected due to its low etch rate in halogen plasmas. Further, alumina has demonstrated good thermal shock resistance, which is another key parameter in terms of material selection for thermal stress applications. The formula for thermal shock resistance is shown in Equation [1]:

$$R = \frac{\sigma_F(1-v)K}{E\alpha},\qquad [1]$$

where R represents the thermal shock resistance, $\sigma_F$ represents the flexural strength of a material (MPa), v represents Poisson's ratio, K represents thermal conductivity (W/mK), E represents Young's modulus (GPa), and a represents the coefficient of thermal expansion (μm/mK). Equation [1] combines several material properties critical to thermal stress resistance by generating a single number that is indicative of how well a material resists thermal stress. The higher the resistance value, the better the material is at handling thermal stress. For example, quartz, which is a dielectric material used in some of the existing plasma chambers, has a thermal shock resistance factor of about 2500. In contrast, alumina has a thermal shock resistance of about 3400, primarily due to a combination of its high strength and high thermal conductivity. Thus, from a thermal stress handling standpoint, alumina is about 1.4 times better as a structural material than quartz for constructing a plasma chamber.

In some embodiments, the dielectric material for constructing the plasma chamber 100 is an oxide or a nitride of one of a group II element, a group III element, a lanthanide, or a mixture thereof. For example, the dielectric material can be one of $Y_2O_3$, $Sc_2O_3$ $La_2O_3$, $Ce_2O_3$, or MgO. As another example, the dielectric material can be one of AlN, BN, or YN.

In some embodiments, plasma resistance of the plasma chamber 100 is enhanced by doping or alloying the dielectric material (e.g., $Al_2O_3$) for forming the plasma chamber 100 with a small amount of an oxide of one of a group II or III element, such as $Y_2O_3$, $Sc_2O_3$ or MgO. It has been shown that mixing $Al_2O_3$ powder with a small amount of $Y_2O_3$ $Sc_2O_3$ or MgO powder and heating the mixture to a temperature of about 1700° C. results in the formation of a stoichiometric alloy of the form $Al_xY_yO_z$, $Al_xSc_yO_z$ or $Al_xMg_yO_z$. Such an alloy has been shown to have lower erosion rates when subject to halogen plasma chemistries, such as F*, Cl* and Br*, as compared to $Al_2O_3$ alone.

In some embodiments, a coating is applied to the inner surface of the first wall portion 208 of the first section 204 and/or the inner surface of the second wall portion 214 of the second section 206 of the plasma chamber 100 prior to bonding the two sections together at the bonding interface 207. As described above, the two wall portions 208, 214 are adapted to form the plasma channel exposed to the plasma therein. Thus, the coating can be applied to the inner surfaces of these two sections such that they directly face the plasma. The coating can comprise one or more of yttria ($Y_2O_3$), $Sc_2O_3$, $La_2O_3$, $Ce_2O_3$, MgO, $SiO_2$, $B_4C$ or an alloy of YAG, which have lower etch rates in halogen plasma compared to $Al_2O_3$. The coating can also comprise $Al_2O_3$. In general, a thicker coating has a longer life than a thinner one, as a thicker coating takes longer to etch through due to erosion. The adhesion of a coating to the plasma chamber surface, however, is related to the coating thickness. When temperature varies, a mismatch in the thermal expansion coefficients of the coating material and base material creates thermo-mechanical stresses at the interface and in the coating material. Such stresses increase with temperature or temperature gradient, and can cause failure of the coating. The optimal coating thickness is in the range of 5 to 1000 μm for most of the above-mentioned coating materials. In some embodiments, the preferred coating thickness is between 10 and 100 μm.

In some embodiments, a coating process such as plasma or flame spray is used to deposit a dense coating of material to the inner surface of the first wall portion 208 and/or to the inner surface of the second wall portion 214, where the coating thickness is on the order of several microns to hundreds of microns. However, spray coating, also known as line-of-sight coating, requires the coating surface to be well exposed to achieve a relatively uniform coating thickness. The piece-wise structure of the plasma source 100, as illustrated in FIG. 2, is particularly suited for spray coating because the inner surfaces of the first wall portion 208 and the second wall portion 214, which form the resulting plasma channel of the plasma chamber 100, are easily accessible and well exposed prior to bonding of the two sections 204, 206.

In an exemplary coating process, a thin layer of an alloying agent (e.g., $Y_2O_3$, $Sc_2O_3$, or MgO) is deposited on the inner surface of at least one of the first wall portion 208 of the first section 204 or the second wall portion 214 of the second section 206, after the two sections 204, 206 are machined in green state, but before the two sections 204, 206 are bonded, as shown in FIG. 2. When the two sections 204, 206 are bonded at the bonding interface 207 using a desired bonding process (e.g., co-firing, sintering, etc.), a thin layer of alloyed coating, such as in the form $Al_xY_yO_z$, $Al_xSc_yO_z$ or $Al_xMg_yO_z$, is generated on at least a portion of the inner surfaces. In some embodiments, the same alloying agent (e.g., $Y_2O_3$, $Sc_2O_3$ or a mixture of $Y_2O_3$ and $Al_2O_3$) is also made into a slurry material and applied to the bonding interface 207 as a bonding agent to eutectically bond the two sections 204, 206 to form the first and second bonded flanges 110, 112. The formation of the eutectic bonding and alloy coating can be achieved in the same bonding process.

In some embodiments, the thickness of the first wall portion 208 and/or the thickness of the second wall portion 214 of the plasma chamber 100 are between about 0.04 inches and about 0.12 inches. The principal limitation of a dielectric plasma chamber (e.g., the plasma chamber 100) is thermo-mechanical stress resulting from the plasma heat load. There are two competing factors that determine the optimal wall thickness as related to thermo-mechanical stress. On the one hand, the thinner the wall of a plasma chamber, the smaller the thermal gradient through the wall thickness. On the other hand, the wall of a plasma chamber needs to be thick enough to have sufficient mechanical strength to counteract thermal stress and other stresses the plasma chamber is subjected to during assembly. An optimal balance between these two factors (i.e., mechanical strength and low thermal gradients) is therefore desired to mitigate thermal stress. A thickness of the first wall portion 208 and/or the second wall portion 214 of the plasma chamber 100 between about 0.04 inches and about 0.12 inches can be chosen to balance these two competing factors.

Figure 3:
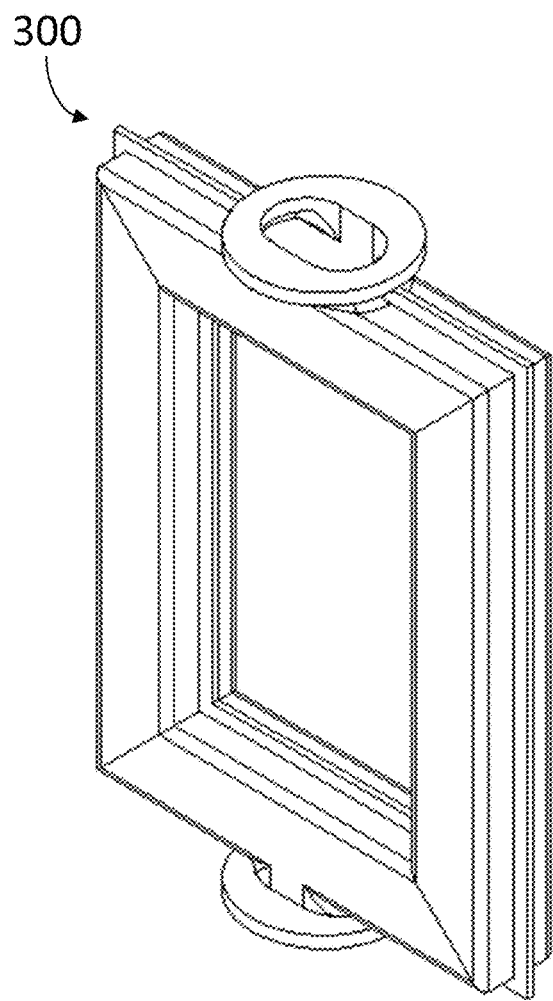
FIG. 3 shows a toroidal plasma chamber having a toroidal plasma channel that is rectangular in shape, according to some embodiments of the present invention.
Figure 4:
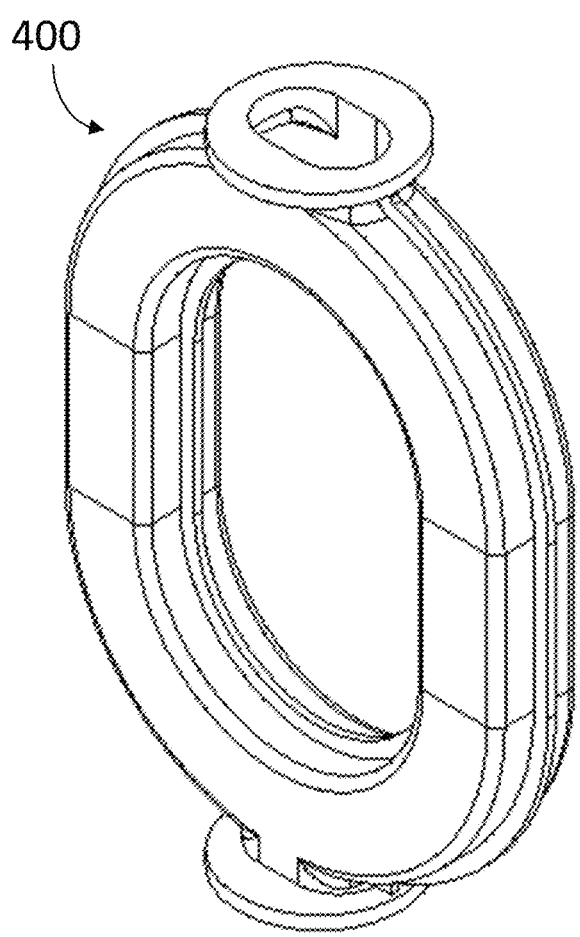
FIG. 4 shows a toroidal plasma chamber having a toroidal plasma channel that is oval in shape, according to some embodiments of the present invention.

Even though FIGS. 1 and 2 show that the toroidal plasma chamber 100 has a toroidal plasma channel that is circular in overall shape, other toroidal channel shapes are possible, such as oval, elliptical or polygon. For example, FIG. 3 shows a toroidal plasma chamber 300 having a toroidal plasma channel that is rectangular in shape, according to some embodiments of the present invention. FIG. 4 shows a toroidal plasma chamber 400 having a toroidal plasma channel that is oval in shape, according to some embodiments of the present invention. The properties and piece-wise manufacturing approaches described above with respect to the toroidal plasma chamber 100 are equally applicable to a linear plasma chamber. For example, in an alternative embodiment, a plasma chamber of the present invention is in the form of a linear plasma channel formed by the disclosed bonding process.

Figure 5:
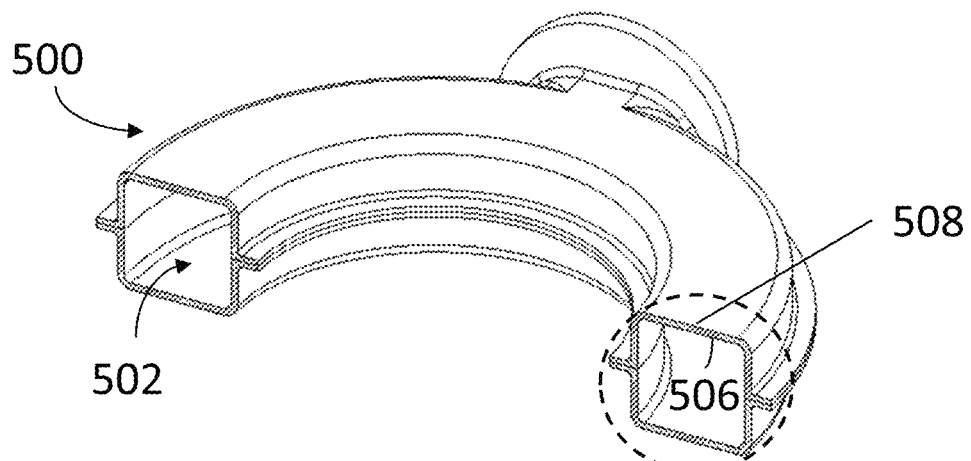
FIG. 5 shows a portion of a toroidal plasma chamber having a plasma channel that has a cross section with a rectangular inner contour and a rectangular outer contour, according to some embodiments of the present invention.
Figure 6:
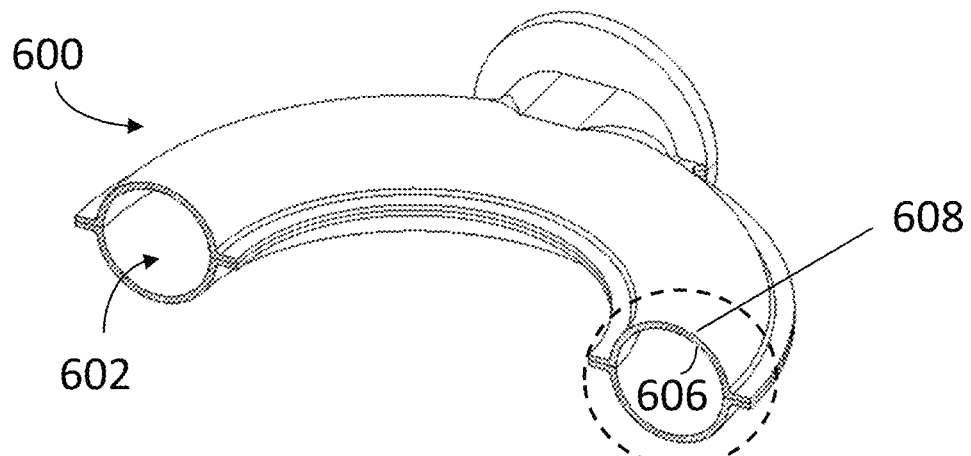
FIG. 6 shows a portion of a toroidal plasma chamber having a plasma channel that has a cross section with a circular inner contour and a circular outer contour, according to some embodiments of the present invention.
Figure 7:
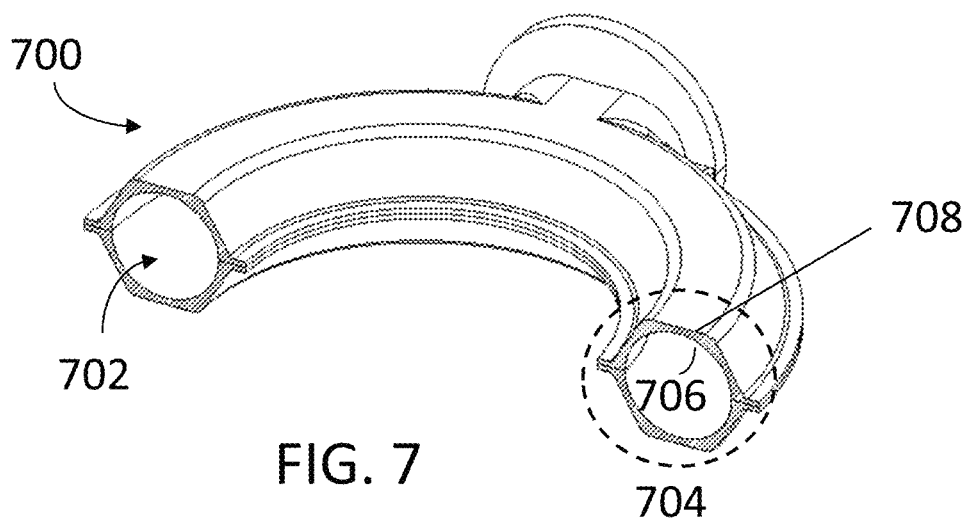
FIG. 7 shows a portion of a toroidal plasma chamber having a plasma channel that has a cross section with a circular inner contour and a hexagonal outer contour, according to some embodiments of the present invention.

The cross section of a plasma channel of the present invention can have different shapes, such as circular, oval, elliptical, polygon or rectangular/square. Moreover, an outer contour and an inner contour of a plasma channel cross section may have the same or different shapes. For example, FIG. 5 shows a portion of a toroidal plasma chamber 500 having a plasma channel 502 that has a cross section 504 with a rectangular inner contour 506 and a rectangular outer contour 508, according to some embodiments of the present invention. FIG. 6 shows a portion of a toroidal plasma chamber 600 having a plasma channel 602 that has a cross section 604 with a circular inner contour 606 and a circular outer contour 608, according to some embodiments of the present invention. FIG. 7 shows a portion of a toroidal plasma chamber 700 having a plasma channel 702 that has a cross section 704 with a circular inner contour 706 and a hexagonal outer contour 708, according to some embodiments of the present invention. In some embodiments, an area of the cross section of a plasma channel is between about 0.2 $cm^2$ and about 50 $cm^2$.

Figure 8A:
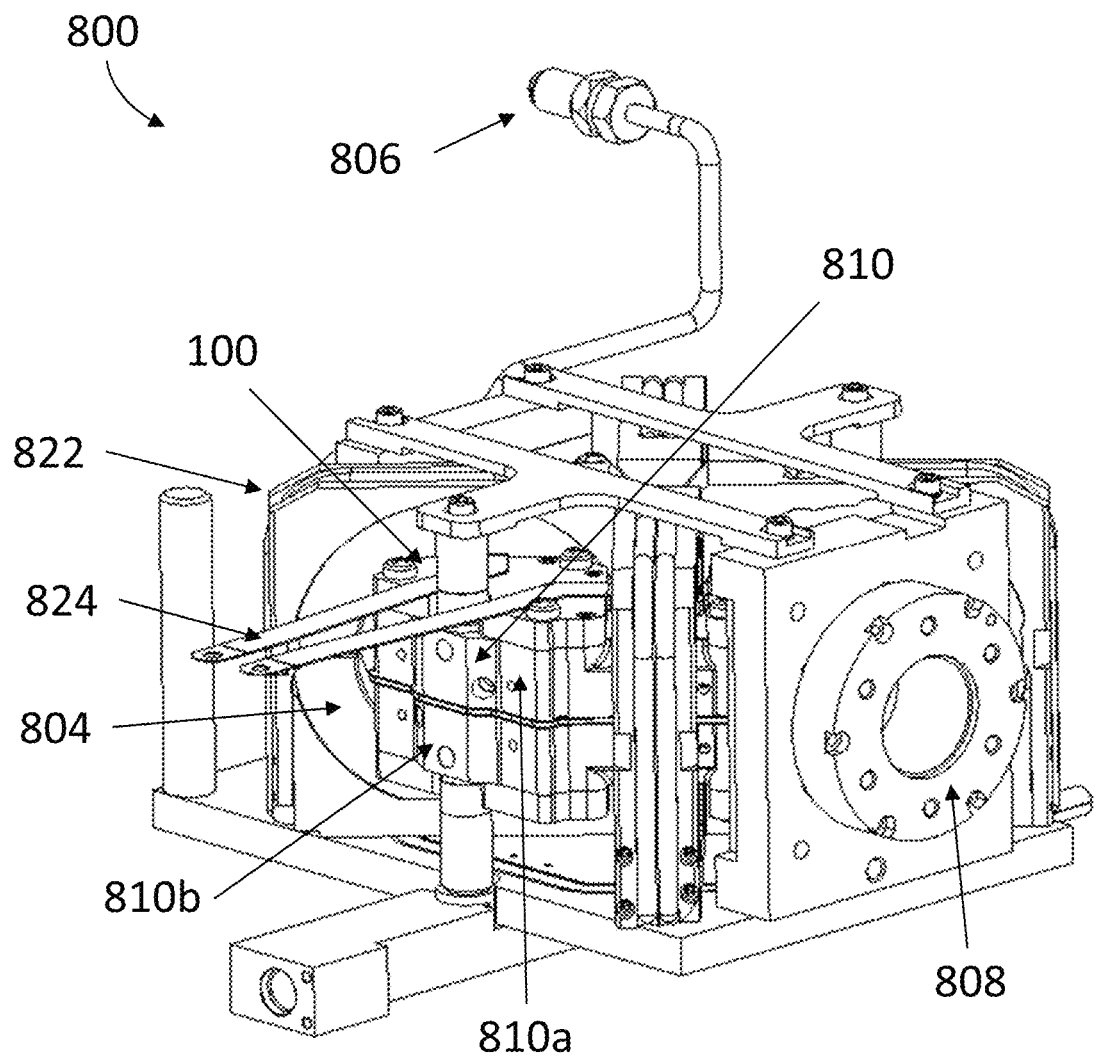
FIG. 8A shows an exemplary plasma processing system including the plasma chamber of FIG. 1, according to some embodiments of the present invention.
Figure 8B:
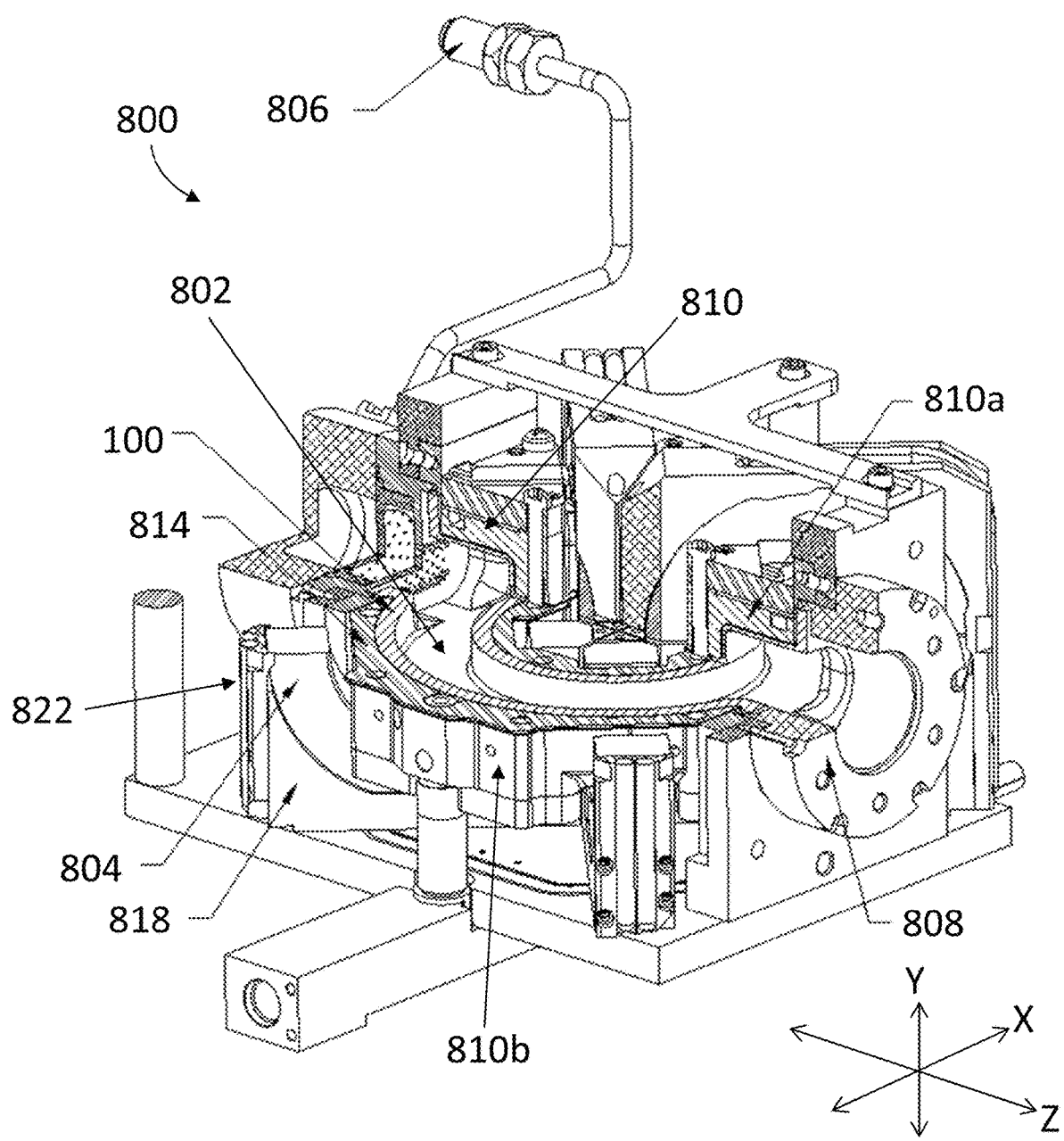
FIG. 8B shows a cutaway view of an exemplary plasma processing system including the plasma chamber of FIG. 1, according to some embodiments of the present invention.
Figure 8C:
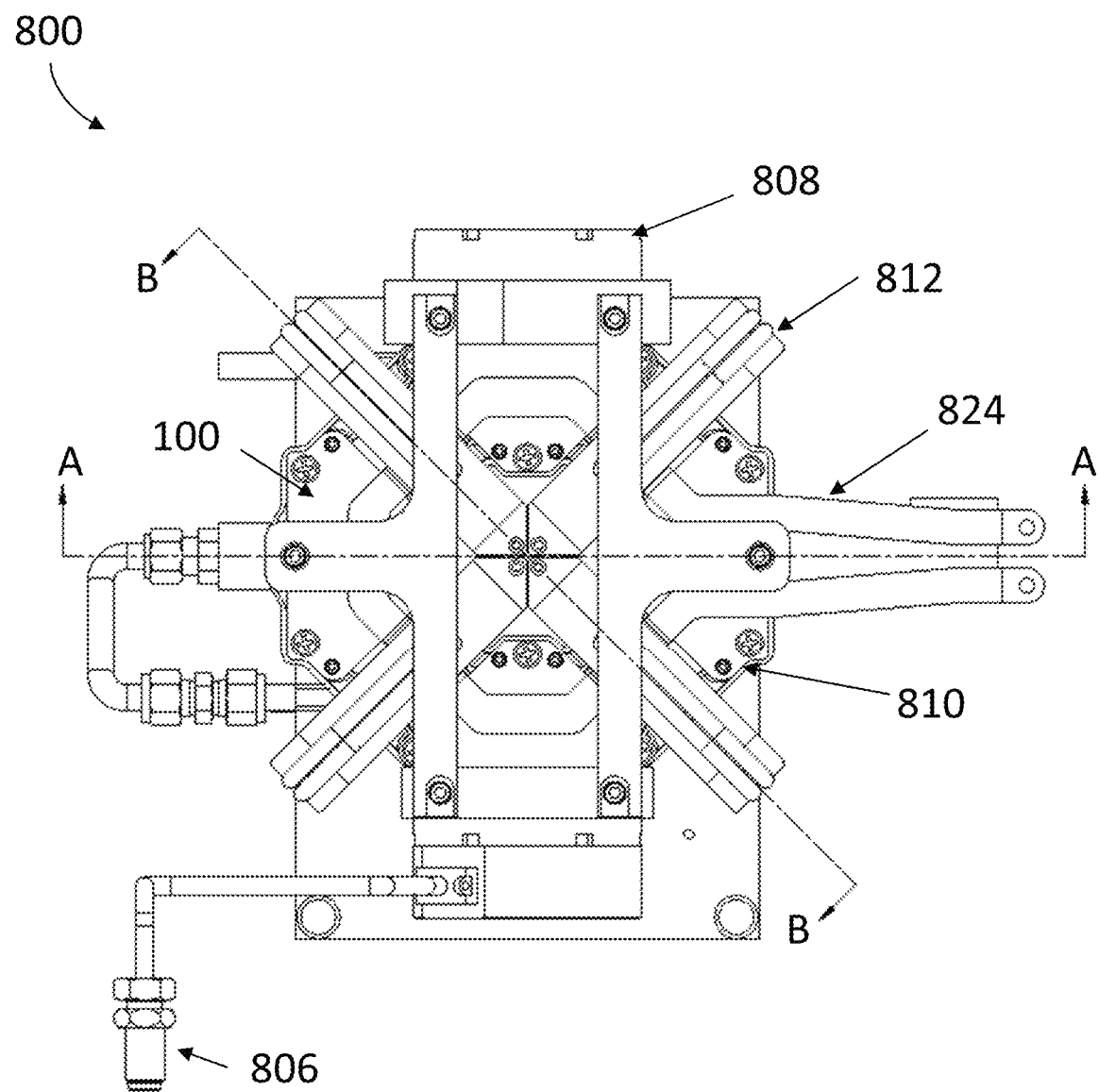
FIG. 8C shows a side view of an exemplary plasma processing system including the plasma chamber of FIG. 1, according to some embodiments of the present invention.

FIGS. 8A-8C show views of an exemplary plasma processing system 800, according to some embodiments of the present invention. FIG. 8A shows an exemplary plasma processing system 800 including the plasma chamber 100 of FIG. 1. FIG. 8B shows a cutaway view of the plasma processing system 800 of FIG. 8A. FIG. 8C shows a side view of the exemplary plasma processing system 800 of FIG. 8A. As shown, the plasma processing system 800 includes the plasma chamber 100 having at least one gas inlet 806 and at least one gas outlet represented by an exit flange 808.

The plasma chamber 100 is surrounded by a heat sink 810 for removing heat from the plasma chamber 100. The heat sink 810 can be formed from multiple segments, such as at least two segments 810a, 810b that substantially enclose the plasma chamber 100. Segmentation of the heat sink 810 can aid the assembly of the system 800, especially when the plasma chamber 100 has a complex shape, such as a toroidal shape. In some embodiments, the heat sink 810 is divided into two segments along the azimuthal plane (i.e., the X-Z plane as indicated in FIG. 8B). The resulting two heat sink segments 810a, 810b can be substantially identical and aligned along the y-axis to form the overall heat sink 810. In some embodiments, the heat sink 810 is formed as a single monolithic component.

The plasma processing system 800 includes a power transformer 822 that couples electromagnetic energy into the plasma chamber 100. The power transformer 822 includes a high permeability magnetic core 804, a primary coil 824, and plasma chamber 100. The plasma chamber 100 allows plasma to form a secondary circuit of the transformer 822. The magnetic core 804 can be supported and cooled by a supporting structure 818. The power transformer 822 can include additional magnetic cores and conductor coils that form additional primary or secondary circuits. For example, the system 800 shown in FIGS. 8A-8C shows the plasma chamber 100 encircled by four transformer cores (e.g., magnetic core 804 and three additional magnetic cores (not labeled)).

Figure 9:
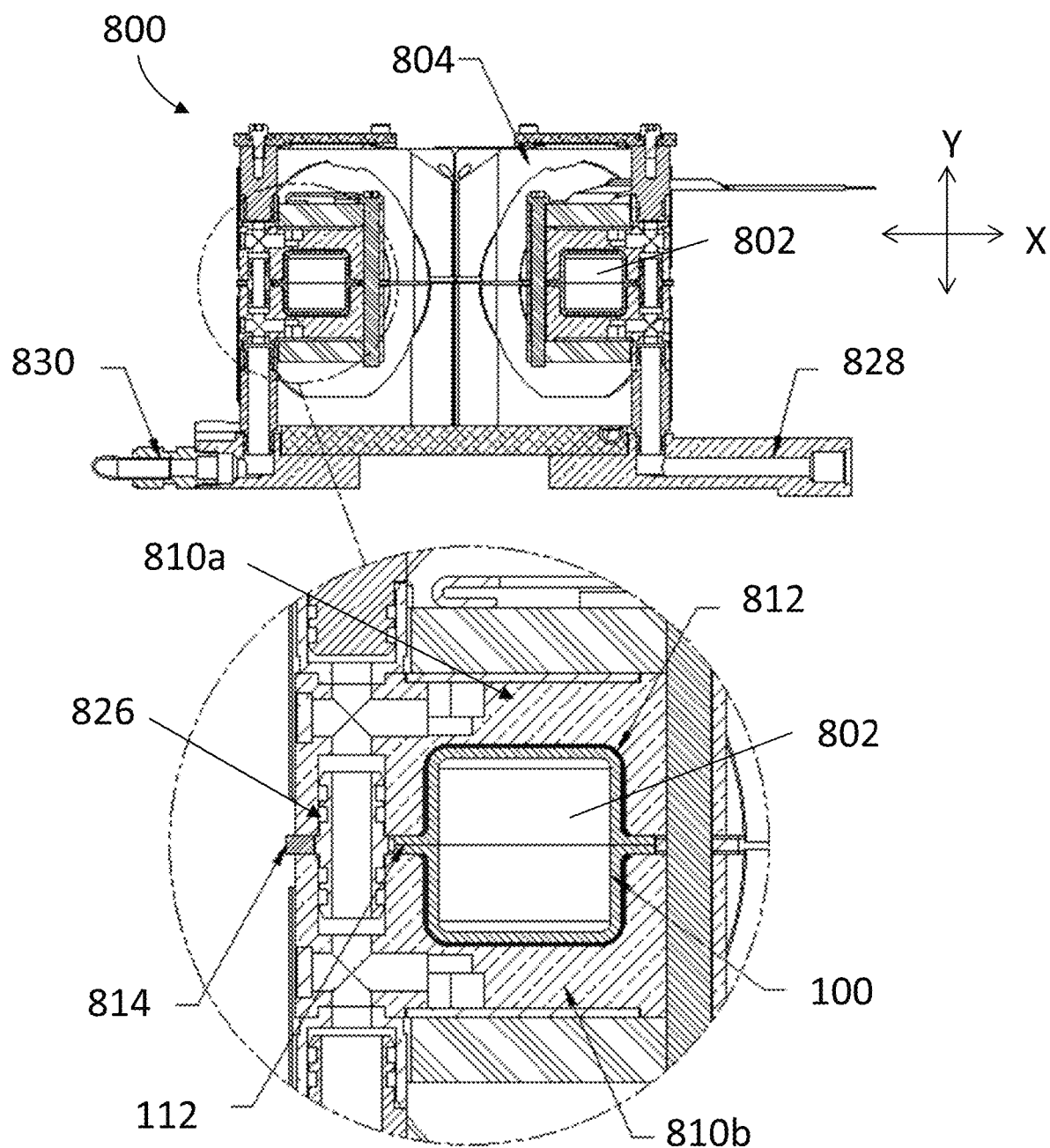
FIG. 9 shows a cross-sectional view of the plasma processing system of FIG. 8C, according to some embodiments of the present invention.

FIG. 9 shows a cross-sectional view of the plasma processing system 800 along the A-A section line shown in FIG. 8C. The plasma processing system 800 includes an assembly that includes the plasma chamber 100 and the heat sink 810, which is placed within the transformer 822. The transformer 822, which includes the magnetic core 804 and one or more primary coils 824 (not shown), is adapted to couple (e.g., inductively couple) electrical power into a plasma generation volume defined by the plasma channel 802 of the plasma chamber 100. The magnetic core 804 together with the primary coils induce an electric field and a current aligned with the plasma channel 802, which allow a plasma in the plasma channel 802 to be ignited and sustained to form a secondary circuit of the transformer 822.

Specifically, in operation, a gas can be fed into the plasma channel 802 via the gas inlet 806 until a pressure between, for example, about 0.001 Torr and about 1000 Torr, is reached. The transformer 822 induces an electric field that ionizes the gas in the plasma channel 802 of the plasma chamber 100 to form a plasma that completes the secondary circuit of the transformer 822. At least a portion of the plasma or the activated gas in the plasma channel 802 can be delivered away from the system 800 via the exit flange 808. In some embodiments, prior to induced electrical power being coupled to the plasma, the gas inside of the plasma channel 802 is ignited by electric fields applied to the plasma channel 802 to create initial electrical breakdown. Several ignition schemes are described in U.S. Pat. Nos. 6,150,628, 7,166,816 and 7,659,489 and assigned to MKS Instruments, Inc. of Andover, MA, the disclosures of which are hereby incorporated by reference in their entireties.

In some embodiments, the heat sink 810 substantially encapsulates/surrounds the plasma chamber 100 with a thermal interface 812 disposed between the heat sink 810 and the plasma chamber 100. The heat sink 810, which is configured to remove heat from the plasma chamber 100, can be formed from an electrically conductive material, such as copper. In some embodiments, cooling fluid is supplied to the cooling jacket via the fluid inlet 828 and removed via the fluid outlet 830. The thermal interface 812 can be a compliant, thermally-conductive pad or a potting compound. The thermal interface 812 has one or more mechanical properties, which permit it to accommodate pressure induced by thermal deformation of the plasma chamber 100 inside the heat sink 810 when the dielectric chamber is subject to heat load from the plasma. The thermal interface 812 can have varying degrees of compliance, such as being easily deformable, which can help to accommodate thermally-induced dimensional changes of the system 800. The thermal interface 812 can also have sufficiently high thermal conductivity to effectively conduct the heat away from the dielectric plasma chamber 100 toward the heat sink 810. The thermal interface 812 can be made compressible by introducing a small amount of porosity (0.1-10% in volume) in the material. In some embodiments, a gap between the plasma chamber 100 and the heat sink 810 is filled with the thermal interface 812, and the gap is about 0.020 inches in width.

In some embodiments, the two heat sink segments 810a, 810b are electrically separated/isolated from each other by one or more dielectric breaks 814 located along the second/outer side 104 and/or the first/inner side 102 of the plasma channel 802. For example, the dielectric breaks 814 can be placed along the first/inner bonded flange 110 and/or the second/outer bonded flange 112 of the plasma chamber 100. These dielectric breaks 814 also provide spacing for the thermal interface 812. For example, the dielectric breaks 814 can be configured to contain the thermal interface material within the gap between the plasma chamber 100 and the heat sink 810 and prevent the thermal interface material from leaking away from the space between the heat sink 810 and the plasma chamber 100.

In some embodiments, the two heat sink segments 810a, 810b are further electrically separated along the toroidal direction of the plasma chamber 100. Such segmentation of the heat sink 810 in the toroidal direction prevents an electric current from being induced in the heat sink 810 that can short the transformer secondary formed by the plasma in the plasma channel 802.

Figure 10:
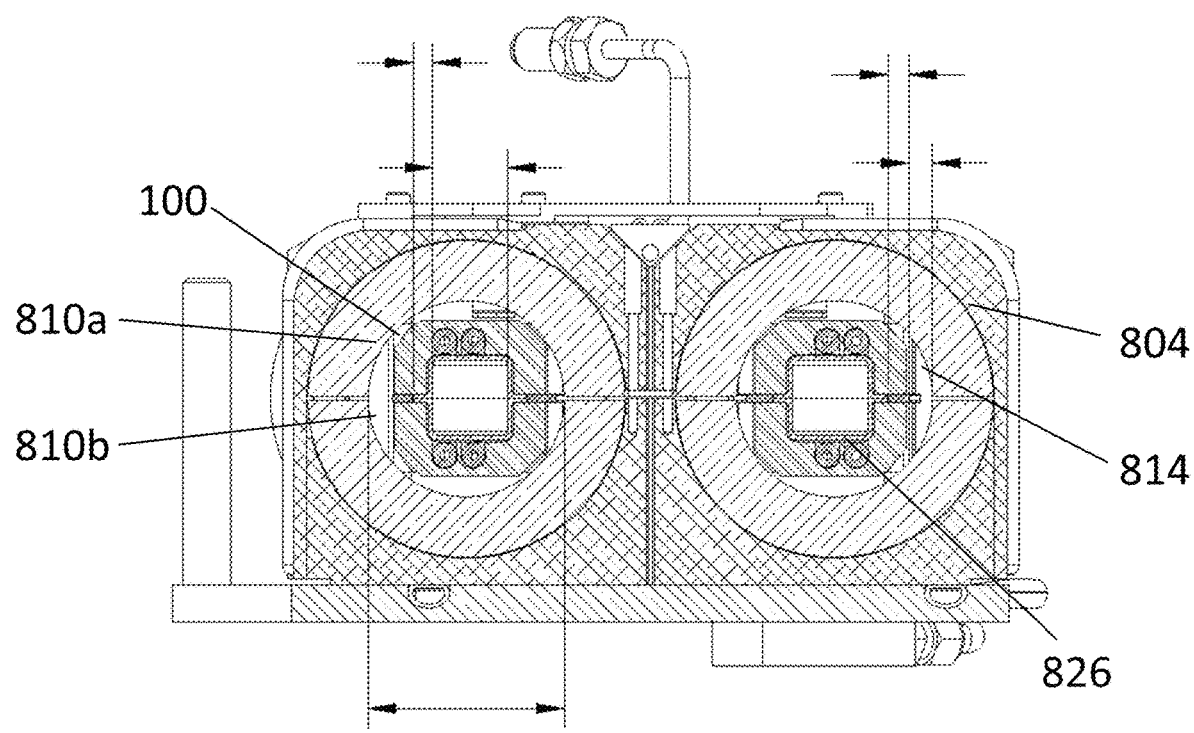
FIG. 10 shows another cross section view of the of the plasma processing system shown in FIG. 8C with electrically separated heat sink segments, according to some embodiments of the present invention.

FIG. 10 shows another cross-sectional view of the plasma processing system 800 that is along the B-B section line shown in FIG. 8C. As shown, the plasma chamber 100 is surrounded by azimuthally-segmented heat sinks 810a and 810b, and is encircled by the magnetic cores (e.g., magnetic core 804). The B-B section line goes across the joints of the toroidally-segmented heat sink 810, with cooling fluid being conducted between the segmented heat sink sections through dielectric fluid couplings 826. In some embodiments, the dielectric fluid couplings 826 are made of high temperature plastics. Similar heat sink segmentation arrangements are described in U.S. Pat. Nos. 7,501,600 and 7,659,489, assigned to MKS Instruments, Inc. of Andover, MA, the disclosures of which are hereby incorporated by reference in their entireties.

Figure 11:
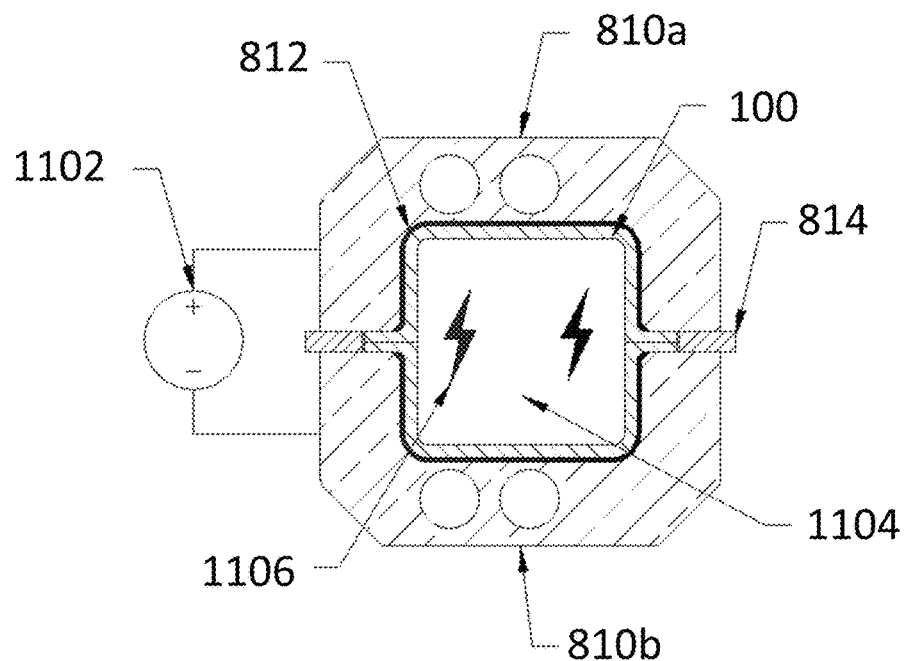
FIG. 11 shows a cross-sectional view of an assembly including the plasma chamber encapsulated by heat sink segments, according to some embodiments of the present invention.

In addition to enabling a strong bond between the two sections 204, 206 of the plasma chamber 100 (see FIG. 2), the first and second bonded flanges 110, 112 provide benefits in terms of reducing temperature and thermal stress. Specifically, because the first and second bonded flanges 110, 112 extend beyond the first and second sides 102, 104 of the plasma channel 802, respectively, they increase the amount of contact surface area between the body of the plasma chamber 100 and the heat sink 810, as illustrated in FIGS. 9 and 11. This additional contact surface can result in a peak temperature reduction in the dielectric plasma chamber 100.

Figure 12A:
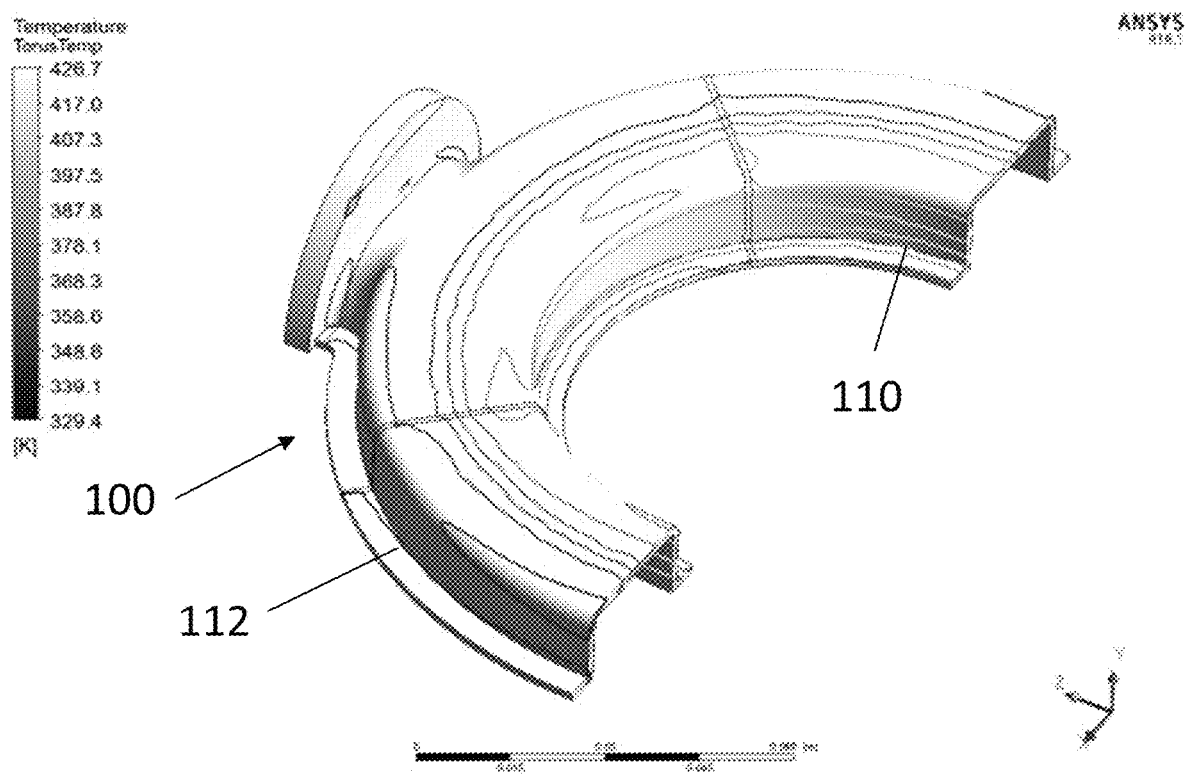
FIGS. 12a and 12b show simulated temperature profiles of the plasma chamber of FIG. 1 with the first and second bonded flanges and a plasma chamber without bonded flanges, respectively, according to some embodiments of the present invention.
Figure 12B:
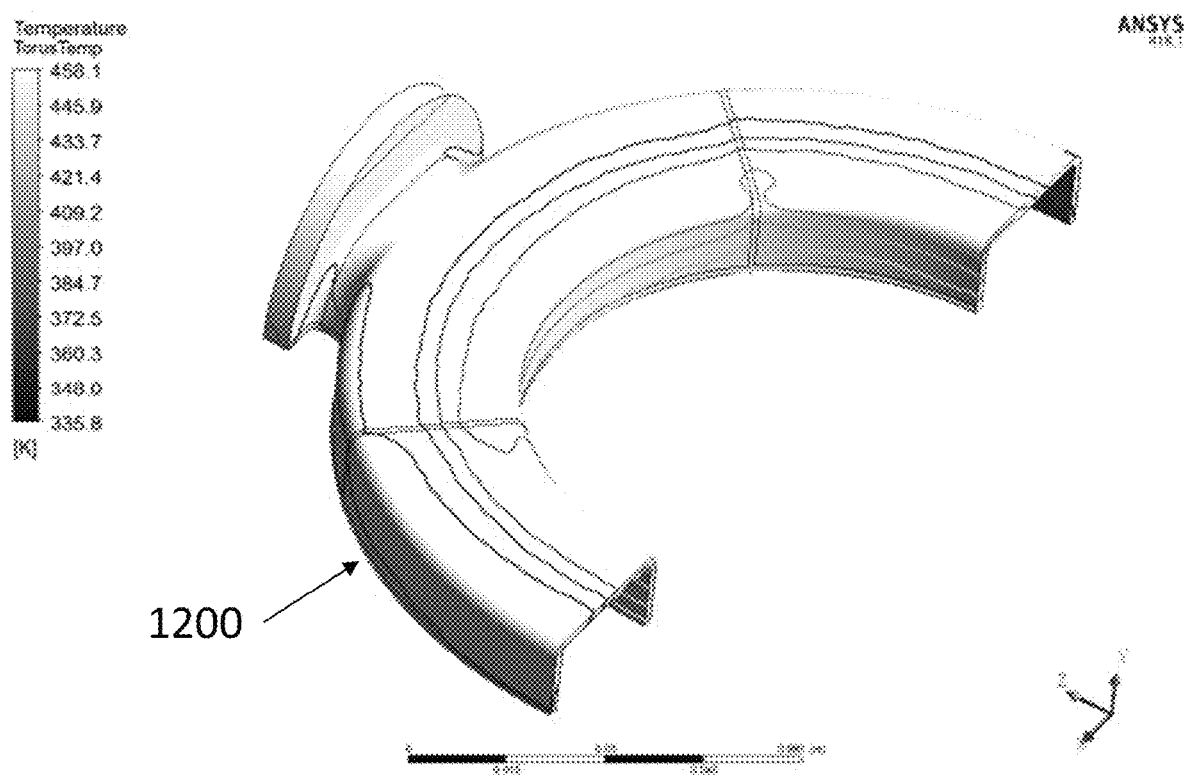

FIG. 12a shows simulated temperature profiles of the plasma chamber 100 of FIG. 1 with the first and second bonded flanges 110, 112 according to an embodiment of the present invention. FIG. 12b shows simulated temperature profiles of a plasma chamber 1200 without bonded flanges. The first and second bonded flanges 110, 112 used in the simulation of FIG. 12a both have a width of 0.25 inches. The simulation uses an inlet cooling water temperature of 30° C. and an operating power load of 6 kilowatts (kW). As shown, the peak temperature is about 185° C. in plasma chamber 1200 without bonded flanges, while the peak temperature is about 153° C. with the bonded flanges 110, 112 according to the exemplary embodiment of the present invention. It shows that the use of bonded flanges 110 and 112 can reduce peak temperature rise in the plasma chamber 100 by about 20%.

Further, the first and second bonded flanges 110, 112 function as stiffening ribs around the first/inner and second/outer sides 102, 104 of the plasma chamber 100, which can reduce deformation and thermal stress of the plasma chamber 100 under a heat load.

In another aspect, the electrical separation/isolation of the two heat sink segments 810a, 810b provided by the dielectric breaks 814 and the bonded flanges 110, 112 of the plasma chamber 100 allow them to be biased at opposite voltages for plasma ignition. FIG. 11 shows a cross-sectional view of an assembly including the plasma chamber 100 encapsulated by the heat sink segments 810a, 810b shown in FIGS. 8A, 8B, 10 and 11. The heat sink segments 810a, 810b can serve as ignition electrodes that are capacitively coupled to the plasma chamber 100, and to which a voltage can be applied for ignition of a gas 1104 in the plasma chamber 100. As shown, the two heat sink segments 810a, 810b can be biased at opposite polarities when connected to a power supply 1102, which can be a DC, RF or pulsed power supply, and the applied voltage can be on the order of several hundred volts to a few kilovolts. As an example, the ignition electrodes in the form of the heat sink segment 810a, 810b can be biased using a 400 kHz RF power supply at about 2-5 kV peak-to-peak voltage. Once the voltage is applied, an electrical breakdown (e.g., electrical breakdown 1106) is created inside the gas 1104 contained in the plasma channel of the plasma chamber 100. Because the ignition electrodes in the form of the heat sink segment 810a, 810b cover substantially the entire second/outer side 104 of the plasma channel, the electrical breakdown 1106 is adapted to cover a large volume of the process gas 1104. This feature, in combination with the use of an induced electric field in the toroidal direction of the plasma chamber 100, enables a toroidal plasma to be formed in the plasma chamber 100.

Figure 13:
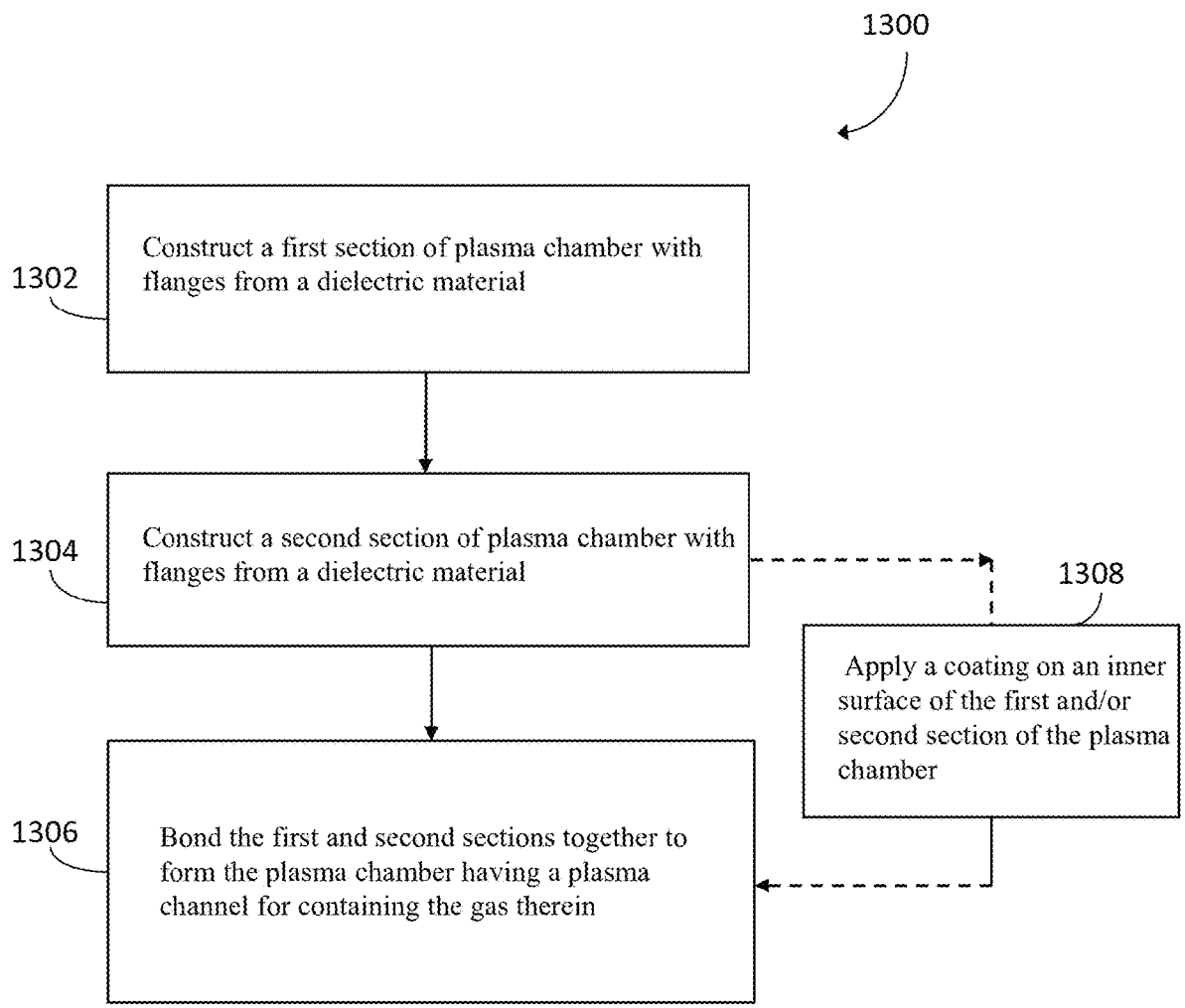
FIG. 13 illustrates an exemplary process for manufacturing the plasma chamber of FIG. 1, according to some embodiments of the present invention.

FIG. 13 illustrates an exemplary process 1300 for manufacturing the plasma chamber 100 of FIG. 1, according to some embodiments of the present invention. The plasma chamber 100 defines an internal plasma channel with a first side 102 (i.e., an inner side if the plasma channel is toroidal) and a second side 104 (i.e., an outer side if the plasma channel is toroidal). At step 1302, the first section 204 of the plasma chamber 100 is constructed from a dielectric material by, for example, machining the dielectric material in a green state. At step 1304, the second section 206 of the plasma chamber 100 is constructed from the same dielectric material or a different dielectric material by, for example, machining the dielectric material in a green state. The first or second section 204, 206 can be the top or bottom half of the plasma chamber 100. The first section 204 has (i) a first flange 210 positioned along the first side 102 of the plasma channel and extending beyond the first side 102 by a first width and (ii) a second flange 212 positioned along the second side 104 of the plasma channel and extending beyond the second side 104 by a second width. Similarly, the second section 206 has (i) a third flange 216 positioned along the first side 102 of the plasma channel and extending beyond the first side 102 by the first width, and (ii) a fourth flange 218 positioned along the second side 104 of the plasma channel and extending beyond the second side 104 by the second width.

In some embodiments, after step 1304, but before the first and second sections 204, 206 are bonded at step 1306, a coating is applied at step 1308 on an inner surface of the first wall portion 208 and/or the second wall portion 214 of at least one of the first section 204 or the second section 206, respectively, where the inner surface of the first or second wall portion 208, 214 form at least a portion of the plasma channel exposed to the plasma therein. In some embodiments, the coating is a layer of alloying agent deposited on an inner surface of the first wall portion 208 and/or the second wall portion 214 of at least one of the first section 204 or the second section 206.

At step 1306, the first and second sections 204, 206 are bonded to form the plasma chamber 100. Bonding the first and second sections 204, 206 involves (i) forming a bond between the first and third flanges 210, 216 of the first and second sections 204, 206, respectively, to generate the first bonded flange 110, and (ii) forming a bond between the second and fourth flanges 212, 218 of the first and second sections 204, 206, respectively, to generate the second bonded flange 112. During this bonding process, if a layer of alloying agent has been disposed in the inner surface of the first wall portion 208 and/or the second wall portion 214, an alloyed coating on the inner surface can be created from the layer of alloying agent by the same bonding process. Even though the manufacturing process 1300 is explained with respect to a toroidal plasma chamber having a toroidal plasma channel, the same process 1300 is also applicable to plasma chambers of other shapes, such as a plasma chamber with a plasma channel that is linear.

In some embodiments, the first section 204 and second section 206 can be joined together using high temperature low vapor pressure epoxy or glass frit bonding. In such an embodiment the first and second sections 204, 206 would be fired/sintered prior to bonding. An epoxy or glass frit can be applied to at least the first and second flanges 210, 212 of the first section 204. The bonding of the first and third flanges 210, 216 and second and fourth flanges 212, 218 would be accomplished by heating the first and second sections cooperatively to either cure the epoxy or melt the glass frit to form the bonding interface 207. A curing temperature of an epoxy is typically between approximately 200-400° C. and melting temperature of glass is approximately 1000-1500° C., both of which are substantially lower than the sintering temperature of high temperature ceramic materials. For example, sintering temperature of alumina ($Al_2O_3$) ceramic is on the order of 2000° C. Due to the difference between the epoxy curing/glass melting temperature and ceramic sintering temperature in such an embodiment the sintering and bonding steps must be separate.

FIGS. 14a-c show another exemplary assembly for forming a plasma chamber according to some embodiments of the present invention. The plasma chamber 1400 is constructed from two discrete sections, including a first section 1404 and a second section 1406, as illustrated in FIGS. 14b and 14c. Each of the first section 1404 and the second section 1406 can comprise a half of the plasma chamber 1400, with one section including a gas inlet and the other section including a gas outlet of the plasma chamber 1400. The two sections can be bonded together at flanges 1410 and 1412 using a bonding agent. In some embodiments, section 1404 and section 1406 are geometrically identical. In some embodiments, section 1404 and section 1406 have different geometries for accommodating or creating gas flow patterns along the plasma chamber 1400. Section 1404, section 1406, and the bonding interface 1407 can be constructed from the same dielectric material, or from two or more different dielectric materials. In some embodiments, a coating is disposed on an inner surface of the plasma chamber that forms at least a portion of the plasma channel exposed to a plasma therein. The coating can comprise one of $Al_2O_3$, $Y_2O_3$, $Sc_2O_3$, $La_2O_3$, $Ce_2O_3$, MgO, $SiO_2$, $B_4C$ or an alloy including YAG. The inner surfaces of the inlet and outlet sections can be coated with different materials for optimization of plasma performance.

In another aspect, the plasma chambers and plasma processing systems of the present invention can be used in a variety of applications, such as in semiconductor wafer processes that require halogen plasmas. One exemplary semiconductor wafer process called atomic layer etch (ALE) requires the use of Cl* plasma and pulsed operation of the plasma source. The dielectric plasma chambers of the present invention (e.g., the plasma chamber 100) are compatible with both of these requirements as they have low erosion rates in Cl* plasma and can be used in pulsed modes due to their ability to quickly ignite in-process gas.

In some embodiments, the plasma processing systems of the present invention, such as the plasma processing system 800, have low ion bombardment energy in high-density plasma environments, thus offering an advantage over other capacitively or inductively coupled sources that suffer from erosion of their plasma-facing surfaces due to ion bombardment from the plasma. Thus, the plasma processing systems of the present invention have low particle generation and long life (e.g., measured in RF hours) under high plasma power densities. Lower particle defects enable higher yields in semiconductor device manufacturing, which is generally sensitive to sub-microscopic particles that can create defects on the devices.

Traditional plasma processing systems are typically made from metals (e.g., aluminum) with dielectric coatings on the inside surfaces to provide sufficient heat conduction to maintain the temperature of the plasma chamber within reasonable limits under high power plasma operating conditions. This material choice is made due to the excellent (e.g., greater than 10 times) thermal conductivity of aluminum in comparison to typical dielectric materials. For a given heat flux (Q W/m2), the temperature difference across a solid is calculated as $\Delta T = Q*Thx/k$, where k is the thermal conductivity of the solid and Thx is the thickness of the solid across which heat is conducted. Thus, to minimize the temperature difference across the solid, k/Thx needs to be maximized. This implies that the choice of material needs to be either metallic with high thermal conductivity or a thinner material of dielectric with lower thermal conductivity. The advantage of using a pure dielectric plasma chamber is that it is able to handle large voltages (e.g., up to tens of kVs) necessary to quickly ignite a plasma in-process gas while a metallic plasma chamber is limited in such capability and typically requires benign ignition conditions (such as argon gas as ignition gas) and further requires a transition to process chemistry to sustain the plasma.

This advantage in the ignition capability of a dielectric plasma chamber enables the dielectric plasma chamber to be filled with electronegative gases (e.g., $O_2$, $NF_3$, $F_2$, $Cl_2$ etc.) during ignition without additional transitioning associated with changing over from noble/electropositive gases to process gases. Such capability also enables plasma to be pulsed (i.e., toggle between ON and OFF states) that is critical for atomic layer processing applications, such as ALE and ALD. Thus, a dielectric plasma chamber becomes the optimal architecture for use in a remote plasma source for pulsed radical delivery applications in comparison to alternatives, such as remote inductively coupled plasma sources or microwave or dielectric barrier discharge based plasma sources.

Figure 15A:
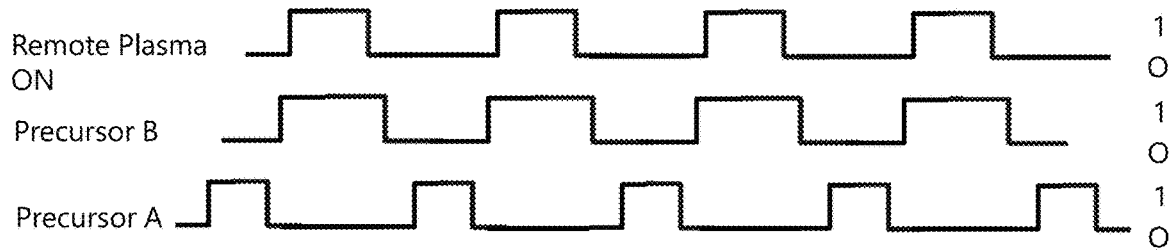
FIGS. 15a-15d show various exemplary pulsed operations using the plasma processing system shown in FIGS. 8A-8C as a remote plasma source, according to some embodiments of the present invention.
Figure 15B:
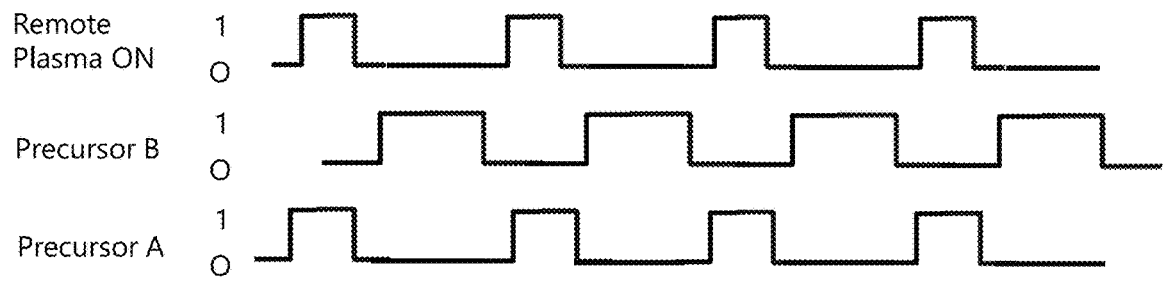
Figure 15C:
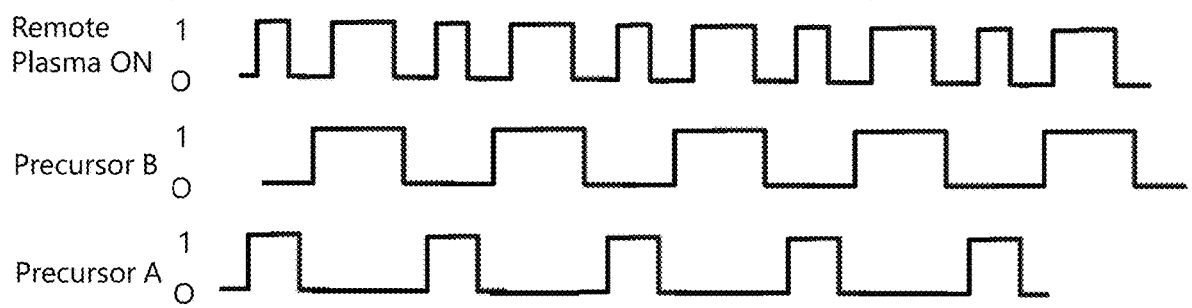

Further, the transformer-coupled plasma processing systems of the present invention, such as the plasma processing system 800, can be operated to deliver specific chemical reactants over a short period of time. FIGS. 15a-15d show various exemplary pulsed operations using the plasma processing system 800 of FIGS. 8A-8C as a remote plasma source, according to some embodiments of the present invention. Specifically, FIG. 15a shows an exemplary pulsed operation when the remote plasma source 800 is only operated (i.e., turned on) when precursor B is flown into the plasma chamber 100 through either the remote plasma source 800, an inlet downstream of the remote plasma source 800, or directly into the plasma chamber 100. Other modes of operating the plasma processing system 800 as a remote plasma source are possible, such as turning on the remote plasma source only for Precursor A, as illustrated in FIG. 15b, or for both Precursors A and B, as illustrated in FIG. 15c.

Figure 15D:
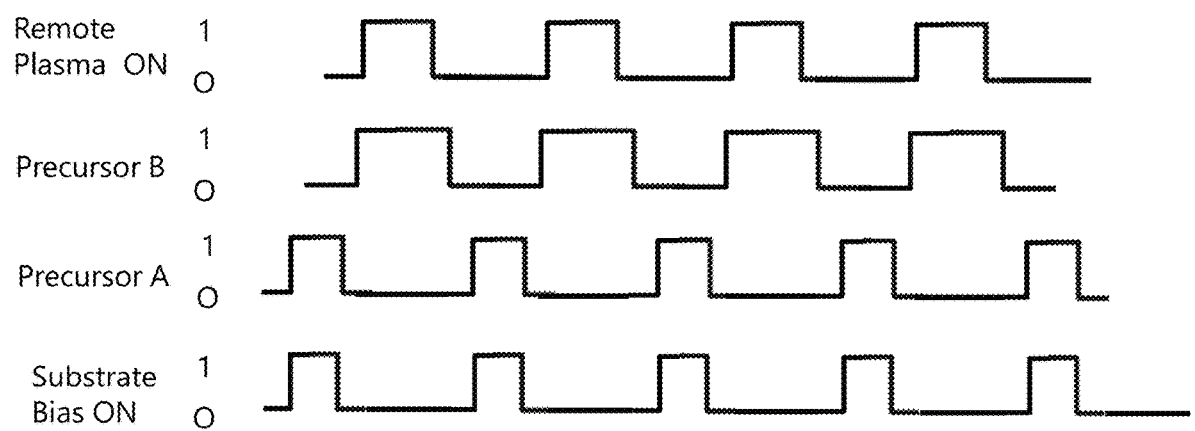

The same principles can be used if there is a single precursor with constant flow and only the remote plasma source is toggled to allow for radical based processing of certain duration within the overall process, where precursor based processes are used to modulate the rate and type of reactions downstream of the remote plasma source. One such example is an ALE process, as illustrated in FIG. 15d, where the precursor flowing through the remote plasma source can include $Cl_2$ or other halogen gases, which is converted to radicals including atomic chlorine and excited chlorine molecules for high reactivity at a periodic interval with some ionic bombardment on the substrate in the intermittent times using an independent bias on the substrate to activate the surface. Generally, there are many ways to optimize these combinations to enable specific applications. One common feature is the ability to have a low particle generating remote plasma source that can provide the radical flux needed for the chemical reactions at the atomic level and the remote plasma source can be toggled on and off quickly based on the process needs to allow for ignition within process gas. Such capability can be achieved by the plasma chambers and plasma processing systems of the present invention. For example, the plasma chambers of the present invention can be formed from a dielectric material and bonded from a clamshell geometry that enables new coating materials to be integrated into the plasma-facing surfaces compatible with desired process chemistries.

In the context of the present invention, the term "about" is defined as within ±50% from the value following the term "about." While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma processing system comprising:
    a plasma assembly including:
        a plasma chamber defining a plasma channel having an inner side and an outer side oppositely disposed along a length of the channel, the plasma chamber comprising (i) two dielectric sections constructed from a dielectric material and (ii) a bonding interface that bonds together the two dielectric sections along a bonding plane to form a hermetic seal between the two sections, wherein the bonding interface includes a first bonded flange extending inward from the inner side along the bonding plane and a second bonded flange extending outward from the outer side along the bonding plane; and
        a heat sink surrounding the plasma chamber, the heat sink being divided into two conductive segments along the bonding plane, wherein the two conductive segments are constructed from a conductive material and are electrically separated from each other; and
    a power transformer including a magnetic core, a primary coil, and the plasma assembly, the power transformer configured to induce an electric field that ionizes a gas in the plasma chamber of the plasma chamber.

2. The plasma processing system of claim 1, wherein the plasma assembly further comprises a thermal interface disposed between the heat sink and the plasma chamber, the thermal interface configured to provide at least one of accommodating thermally-induced deformation of the plasma chamber or conducting heat away from the plasma chamber toward the heat sink.

3. The plasma processing system of claim 2, wherein the thermal interface is constructed from a compliant, thermally-conductive material.

4. The plasma processing system of claim 1, wherein
the second bonded flange is configured to extend outward from the outer side of the plasma chamber parallel to the bonding plane, and
wherein the first bonded flange is configured to extend inward from the inner side of the plasma chamber parallel to the bonding plane.

5. The plasma processing system of claim 4, wherein the plasma assembly further comprises one or more dielectric breaks located along at least one of the second bonded flange or the first bonded flange of the plasma chamber at the bonding interface.

6. The plasma processing system of claim 5, wherein the two conductive segments of the heat sink are electrically separated by the one or more electric breaks and at least one of the second or first bonded flanges at the bonding interface.

7. The plasma processing system of claim 1, wherein the plasma assembly further comprises one or more dielectric fluid couplings located in the plasma assembly, the dielectric fluid couplings in fluid communication with the conductive segments of the heat sink for conducting a cooling fluid between the conductive segments.

8. The plasma processing system of claim 1, further comprising a supporting structure configured to support and cool the magnetic core of the power transformer.

9. The plasma processing system of claim 1, wherein the bonding interface comprises a bonding agent that is one of a glass frit, a eutectic mixture or an epoxy.

10. The plasm processing system of claim 1, wherein a first of the dielectric sections of plasma chamber and a first of the conductive segments of heat sink are located in a first half of the transformer relative to the bonding plane, and a second of the dielectric sections of plasma chamber and a second of the conductive segments of heat sink are located in a second half of the transformer relative to the bonding plane.

11. The plasma processing system of claim 10, wherein the first and second dielectric sections of the plasma chamber are identical, and the first and second conductive segments of the heat sink are identical.

12. A method for operating a plasma processing system, the method comprising:
providing the plasma processing system including a power transformer having at least one magnetic core, a primary coil, and a plasma assembly, wherein the plasma assembly includes (i) a plasma chamber defining a plasma channel having an inner side and an outer side oppositely disposed along a length of the channel, the plasma chamber created by two dielectric sections bonded together to form a bonding interface along a bonding plane, the bonding interface includes a first bonded flange extending inward from the inner side along the bonding plane and a second bonded flange extending outward from the outer side along the bonding plane and (ii) a heat sink surrounding the plasma chamber, the heat sink being divided into two conductive segments along the bonding plane and electrically separated from each other;
supplying a gas to the plasma channel via a gas inlet;
inducing, by the power transformer, an electric field that ionizes the gas in the plasma channel of the plasma chamber to form a plasma therein; and
delivering at least a portion of the plasma out of the plasma channel via an exit flange.

13. The method of claim 12, further comprising biasing the two conductive segments of the heat sink at opposite voltages to ignite the gas in the plasma channel prior to inducing the electric field in the plasma channel.

14. The method of claim 12, further comprising electrically isolating the two conductive segments at the bonding interface by one or more electric breakers and at least one of the first bonded flange or the second bonded flange of the plasma chamber.

15. The method of claim 14, wherein the second bonded flange extends outward from the outer side of the plasma chamber parallel to the bonding plane, and (ii) the first bonded flange extends inward from the inner side of the plasma chamber parallel to the bonding plane.

16. The method of claim 15, further comprising increasing an amount of contact surface between the plasm chamber and the heat sink by the first and second bonded flanges of the plasma chamber, thereby decreasing a peak temperature in the plasma chamber.

17. The method of claim 15, further comprising stiffening the plasma chamber within the power transformer by the first and second bonded flanges of the plasma chamber, thereby reducing deformation and thermal stress of the plasma chamber.

18. The method of claim 12, further comprising cooling the heat sink by conducting a cooling fluid through a plurality of dielectric fluid couplings that are in fluid communication with the two conductive segments of the heat sink.

19. The method of claim 12, further comprising reducing thermally-induced deformation of the plasma chamber by a thermal interface located between the plasma chamber and the heat sink.

20. The method of claim 19, wherein the thermal interface is further configured to conduct heat away from the plasma chamber toward the heat sink.

21. The method of claim 12, further comprising operating the plasma processing system as a remoted plasma source in a pulsed operation.

* * * * *